United States Patent
Suetsuna et al.

(10) Patent No.: US 8,475,922 B2
(45) Date of Patent: Jul. 2, 2013

(54) NANOPARTICLE COMPOSITE MATERIAL AND ANTENNA DEVICE AND ELECTROMAGNETIC WAVE ABSORBER USING THE SAME

(75) Inventors: Tomohiro Suetsuna, Kawasaki (JP); Seiichi Suenaga, Yokohama (JP); Tomoko Eguchi, Tokyo (JP); Koichi Harada, Tokyo (JP); Maki Yonetsu, Mitaka (JP); Yasuyuki Hotta, Tokyo (JP); Toshihide Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 12/888,671

(22) Filed: Sep. 23, 2010

(65) Prior Publication Data

US 2011/0217543 A1   Sep. 8, 2011

(30) Foreign Application Priority Data

Mar. 5, 2010  (JP) ................................. 2010-049551

(51) Int. Cl.
   *B32B 5/16* (2006.01)
(52) U.S. Cl.
   USPC ..... 428/403; 428/842; 428/842.1; 428/842.2; 428/842.3; 428/328; 343/787; 252/62.54
(58) Field of Classification Search
   USPC ................ 428/842, 842.1, 842.2, 842.3, 403, 428/328; 343/787; 252/62.54
   See application file for complete search history.

(56) References Cited

U.S. PATENT DOCUMENTS

| | | | |
|---|---|---|---|
| 5,183,631 A | | 2/1993 | Kugimiya et al. |
| 6,102,980 A | | 8/2000 | Endo et al. |
| 7,429,339 B2 | * | 9/2008 | Renaud et al. ............. 252/62.54 |
| 7,534,489 B2 | * | 5/2009 | Ying et al. ..................... 428/402 |
| 7,556,743 B2 | * | 7/2009 | Furman et al. ........... 252/299.01 |
| 8,066,969 B2 | * | 11/2011 | Cheon et al. ................ 423/592.1 |
| 2008/0220231 A1 | | 9/2008 | Suetsuna et al. |
| 2009/0167623 A1 | | 7/2009 | Tsujimura et al. |
| 2009/0242826 A1 | | 10/2009 | Harada et al. |
| 2009/0267017 A1 | | 10/2009 | Matsukawa et al. |
| 2010/0060538 A1 | | 3/2010 | Suetsuna et al. |
| 2010/0060539 A1 | | 3/2010 | Suetsuna et al. |
| 2012/0038532 A1 | * | 2/2012 | Yonetsu et al. ............... 343/787 |

FOREIGN PATENT DOCUMENTS

| | | |
|---|---|---|
| JP | 02-022804 | 1/1990 |
| JP | 2750722 | 8/1990 |
| JP | 2687683 | 1/1992 |
| JP | 6-267723 | 9/1994 |
| JP | 08-306520 | 11/1996 |
| JP | 10-335128 | 12/1998 |
| JP | 2006-097123 | 4/2006 |
| JP | 2007-006465 | 1/2007 |
| JP | 2007-107094 | 4/2007 |
| JP | 2009-290624 | 12/2009 |

* cited by examiner

*Primary Examiner* — Leszek Kiliman
(74) *Attorney, Agent, or Firm* — Finnegan, Henderson, Farabow, Garrett & Dunner, LLP

(57) ABSTRACT

According to one embodiment, there is provided a nanoparticle composite material, including nanoparticle aggregates in a shape having an average height of 20 nm or more and 2 μm or less and having an average aspect ratio of 5 or more, the nanoparticle aggregates including metal nanoparticles having an average diameter of 1 nm or more and 20 nm or less and containing at least one magnetic metals selected from the group consisting of Fe, Co and Ni and binder existing between the nanoparticle aggregates.

11 Claims, 6 Drawing Sheets

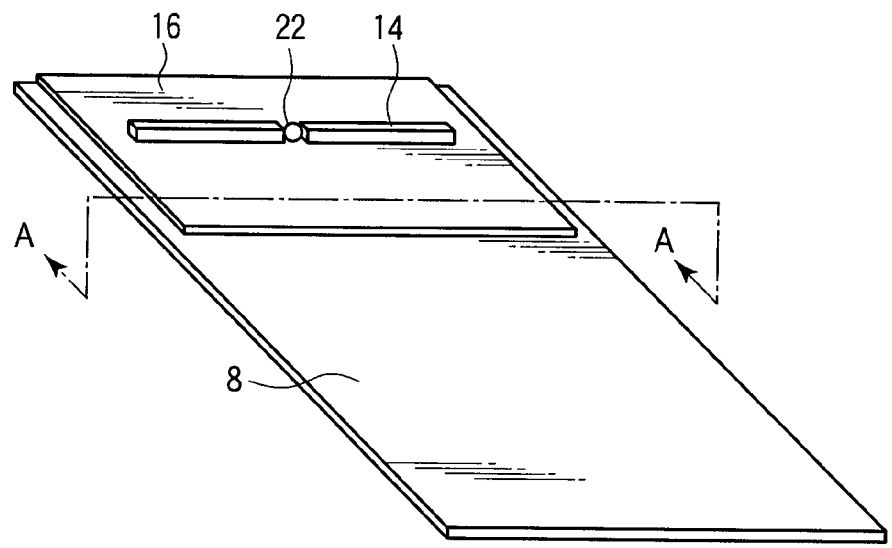
F I G. 2A
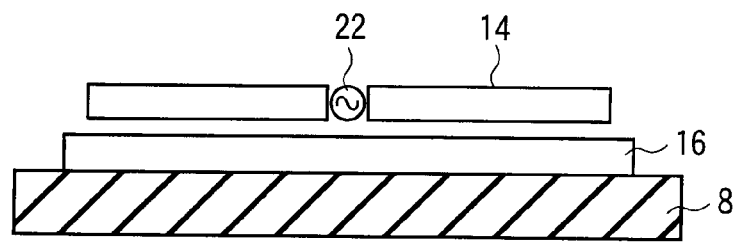
F I G. 2B

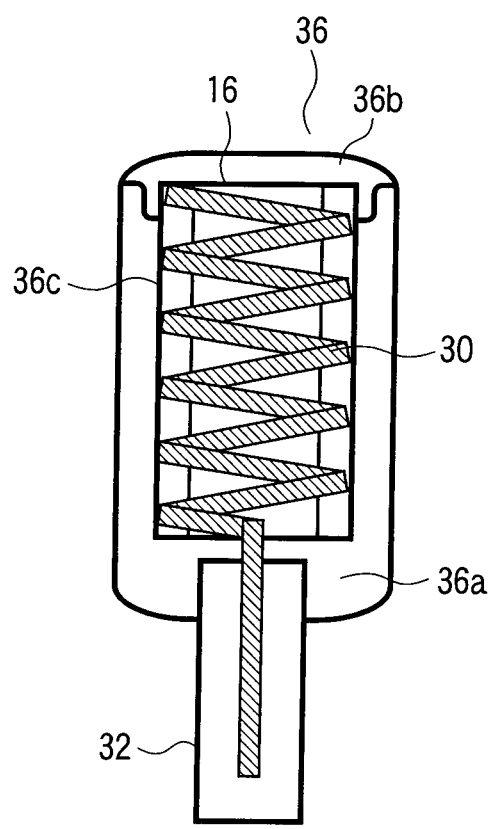
F I G. 7

NANOPARTICLE COMPOSITE MATERIAL AND ANTENNA DEVICE AND ELECTROMAGNETIC WAVE ABSORBER USING THE SAME

CROSS-REFERENCE TO RELATED APPLICATIONS

This application is based upon and claims the benefit of priority from Japanese Patent Application No. 2010-049551, filed Mar. 5, 2010; the entire contents of which are incorporated herein by reference.

FIELD

Embodiments described herein relate generally to a nanoparticle composite material and an antenna device and an electromagnetic wave absorber using the same.

BACKGROUND

In recent years, magnetic materials have been used for devices such as electromagnetic wave absorbers, magnetic inks, inductance elements, and antenna devices, and their importance is increasing year by year. These components are used according to the properties, such as real part of magnetic permeability (real part of relative permeability) $\mu'$ or imaginary part of magnetic permeability (imaginary part of relative permeability) $\mu''$, of the magnetic material used. For example, inductance elements and antenna devices use a component having high $\mu'$ (and also low $\mu''$), while electromagnetic wave absorbers use a component having high $\mu''$. Thus before a component is used actually as a device, $\mu'$ and $\mu''$ of the component should be adjusted to the frequency band of the device used. In recent years, the frequency band used by devices is becoming high, and there is thus an urgent need for a material having $\mu'$ and $\mu''$ values that can be adjusted at high frequency.

Magnetic materials having high $\mu'$ and low $\mu''$ values at high frequency are particularly highly expected in their application to devices for high-frequency communication products such as antenna devices. Current portable communication terminals use radio signals for most of information transmission. The frequency band of the radio signals currently used is a high-frequency region of 100 MHz or more. Thus, electronic parts and boards useful in the high-frequency region are attracting attention. Radio signals in a high-frequency range of the gigahertz band are used in mobile device communication and also in satellite communication.

As a method of reducing the size of the antenna and the power consumption, there is a method of performing communication by using an insulating substrate having high magnetic permeability (high $\mu'$, low $\mu''$) as the antenna board and thus preventing transmission of the radio signal from the antenna to electronic parts or boards in the communication device. More preferably, it is possible in this way to reduce the size of the antenna and the power and to expand the band of a resonant frequency of the antenna simultaneously.

When a high-magnetic-permeability material is used particularly for an antenna board, the thickness of the material should be 10 μm or more, preferably 100 μm or more. Currently, there is no insulative high-magnetic-permeability thick-film material having a thickness of 10 μm or more, preferably 100 μm or more that shows high magnetic permeability in a high-frequency band, particularly in the gigahertz band range. Thus, there is a demand, as an antenna board material, for a thick-film high-magnetic-permeability, insulative material (high $\mu'$ and low $\mu''$) that can be used for high-frequency radio signals and has a transmission loss as low as possible.

Electromagnetic wave absorbers absorb noise at a high frequency generated by electronic devices and reduce problems such as malfunction of the electronic devices, by using their high $\mu''$. The electronic devices include semiconductor elements such as IC chips, various communication devices and the like. There are many kinds of electronic devices including those that are used in the frequency range of 1 MHz to several gigahertz, in particular in the high-frequency range of several tens of gigahertz or more.

For use of a magnetic material in high-frequency devices such as inductance elements, antennas and electromagnetic wave absorbers, efforts are made to flatten the shape of a magnetic material powder.

For example, JP-A H06-267723 (KOKAI) discloses a flat magnetic material powder containing soft magnetic metal particles having an aspect ratio, i.e., average major-axis length divided by average thickness, of 2 or more.

JP-A H06-267723 (KOKAI) describes that it is possible to raise the magnetic permeability at 100 kHz by flattening the particle. However, according to JP-A H06-267723 (KOKAI), because a flat particle has a large thickness of 100 μm, there is often eddy current generated, leading to increased magnetic loss by the eddy current loss, when an AC magnetic field is applied. Actually, the magnetic permeability of the particle at 100 kHz was studied in the Examples, and the magnetic loss at a frequency higher than that in the megahertz to gigahertz region becomes larger, and thus, it was considered that it cannot be used in high-frequency devices (such as inductance elements, antennas, electromagnetic wave absorbers, etc.).

Various materials have been proposed as the magnetic material for use at high frequency (high-magnetic-permeability material or wave absorber), but none of them satisfied the requirements in material properties ($\mu'$, $\mu''$, insulation properties, thickness, etc.).

BRIEF DESCRIPTION OF THE DRAWINGS

FIGS. 2A and 2B are views showing a configuration of an antenna device of a third embodiment;

FIG. 7 is a detailed view showing a configuration of the antenna device of the fifth embodiment.

DETAILED DESCRIPTION

In general, according to one embodiment, there is provided a nanoparticle composite material, including nanoparticle aggregates in a shape having an average height of 20 nm or more and 2 μm or less and having an average aspect ratio of 5 or more, the nanoparticle aggregates including metal nanoparticles having an average diameter of 1 nm or more and 20 nm or less and containing at least one magnetic metals selected from the group consisting of Fe, Co and Ni, and a binder existing between the nanoparticle aggregates.

Hereinafter, embodiments of the present invention will be described with reference to drawings.

First Embodiment

The nanoparticle composite material in the present embodiment is characterized by including nanoparticle aggregates in a shape having an average height of 20 nm or more and 2 μm or less and having an average aspect ratio of 5 or more, the nanoparticle aggregates including metal nanoparticles having an average diameter of 1 nm or more and 20 nm or less and containing at least one magnetic metals selected from the group consisting of Fe, Co and Ni, and a binder existing between the nanoparticle aggregates.

Figure 1:
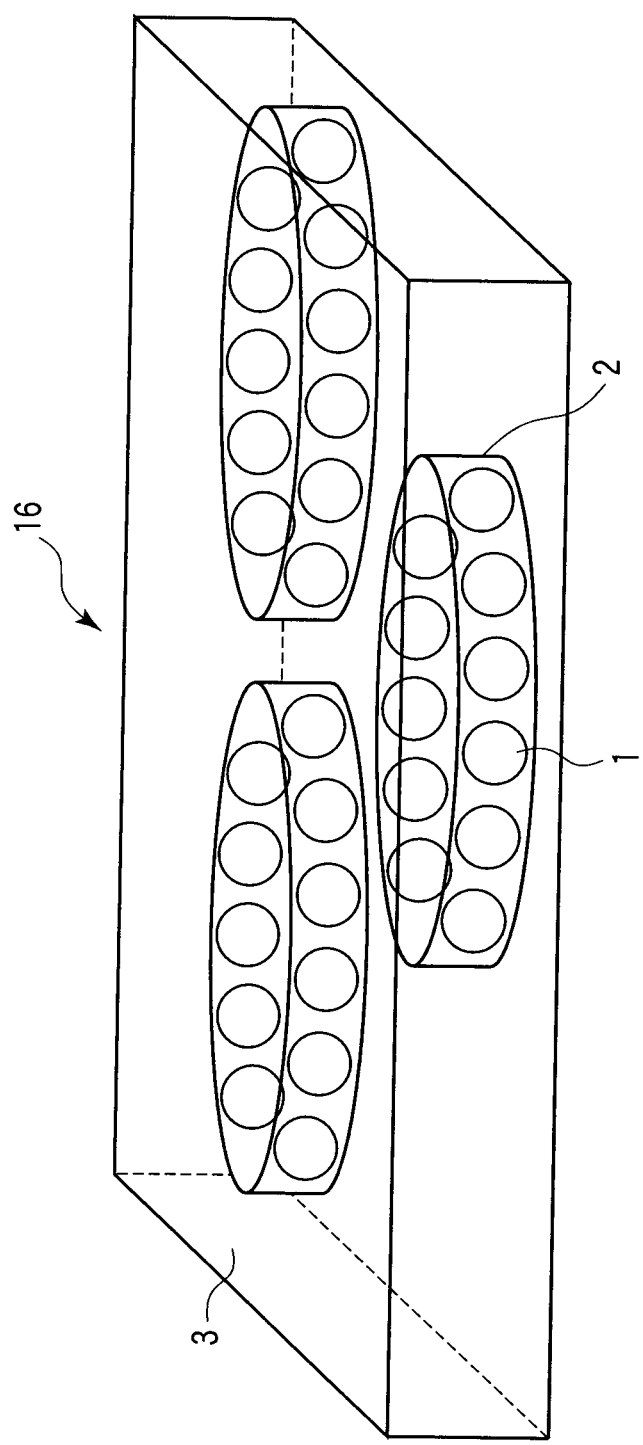
FIG. 1 is a view showing an example of a nanoparticle composite material of an embodiment.

For example, the nanoparticle composite material 16 in the present embodiment has the configuration shown in FIG. 1. Specifically, a nanoparticle composite material 16 contains multiple nanoparticle aggregates 2 containing multiple metal nanoparticles 1 and a binder 3 existing between the nanoparticle aggregates 2. Although FIG. 1 shows an example of the nanoparticle composite material 16 that the binder 3 is tightly filled between the nanoparticle aggregates 2, the nanoparticle composite material 16 in the present embodiment is not limited to this example. For example, the binder 3 may exist partially between the nanoparticle aggregates 2. In the nanoparticle composite material 16, the nanoparticle aggregates 2 need not separate each other, parts of the nanoparticle aggregates 2 may be connected or contacted.

Individual metal nanoparticles easily bind to each other, acting as one aggregate magnetically in such a nanoparticle aggregate. When the shape of the nanoparticle aggregate has an average height of 20 nm or more and 2 μm or less and has an average aspect ratio of 2 or more, preferably 5 or more, more preferably 10 or more, it is possible to provide the aggregate with shape magnetic anisotropy and improve the magnetic permeability and high frequency characteristics of magnetic permeability thereof. It is thus possible to raise the peak frequency (resonance frequency) of the imaginary part of magnetic permeability and decrease the magnetic loss in the frequency band lower than the resonance low frequency. It is also possible to orient the nanoparticle aggregates by magnetic field in preparation of a desired material (nanoparticle composite material) by integration of the nanoparticle aggregates and to improve the high-frequency characteristics of magnetic permeability of the resulting material.

In addition, such nanoparticle aggregates can be processed into a thick film, and the thickness of the film can be increased to 10 μm or more.

The "aspect ratio" above is a ratio of height to diameter (height/diameter). When the nanoparticle aggregate is spherical, the height is identical with the diameter and thus, the aspect ratio is 1. In the case of a plate-shaped nanoparticle aggregate, the aspect ratio is expressed by (width/thickness), as the length or the width, whichever is longer, is used as the width. In the case of a flat elliptical nanoparticle aggregate, the aspect ratio is expressed by (diameter/height). In the case of a rod-shaped nanoparticle aggregate, the aspect ratio is (length of rod/diameter of the bottom face of rod). In the case of a spheroidal nanoparticle aggregate, the aspect ratio is (major axis/minor axis).

The "height" is the diameter in the case of a spherical aggregate, the thickness in the case of a plate-shaped aggregate, the height in the direction perpendicular to the diameter in the case of a flat elliptical aggregate, the length in the case of a rod-shaped aggregate, and the minor-axis length in the case of a spheroidal aggregate.

The metal nanoparticles have an average diameter of 1 nm or more and 20 nm or less. An average diameter of less than 1 nm may lead to superparamagnetism and thus decrease of magnetic flux. On the other hand, an average diameter of more than 20 nm may lead to increase of eddy current loss in a high-frequency region and decrease of magnetic characteristics in a desired high-frequency region. When the diameter of a nanoparticle increases, multiple magnetic domain structure is more stabilized than single magnetic domain structure, from the point of energy, as its magnetic domain structure. In the case of the nanoparticle aggregate of the present embodiment, it is needed to make the eddy current loss of individual nanoparticle as low as possible, to keep the magnetic domain structure of a past particle as the single magnetic domain structure and thus to increase the magnetic coupling between particles, and the particle diameter range suitable for that purpose is 1 nm or more and 20 nm or less. Preferably when the average diameter is in the range above, it is possible to improve the magnetic permeability and the high frequency characteristics of magnetic permeability of the nanoparticle aggregate.

The magnetic metal contained in the metal nanoparticle includes at least one metal selected from the group consisting of Fe, Co and Ni and in particular, Fe-based alloys, Co-based alloys and FeCo-based alloys are preferable for high saturation magnetization. Examples of the Fe-based alloys include FeNi alloys, FeMn alloys and FeCu alloys respectively containing Ni, Mn and Cu as the second component. Examples of the Co-based alloys include CoNi alloys, CoMn alloys and CoCu alloys respectively containing Ni, Mn and Cu as the second component. The FeCo-based alloys may be alloys containing Ni, Mn, Cu or the like as the second component. The second component is a component effective for improvement of the high-frequency magnetic characteristics of the nanoparticle aggregate.

Among the magnetic metals, use of a FeCo-based alloy is particularly preferable. The Co content in the FeCo alloy is preferably 10 atomic % or more and 50 atomic % or less, for satisfying the requirements in thermal stability and oxidation resistance and also of a saturation magnetization of 2 tesla or more. More preferably, the Co content in the FeCo alloy is in the range of 20 atomic % or more and 40 atomic % or less, for improvement in saturation magnetization.

As in the present embodiment, the metal nanoparticle preferably contains non-magnetic metals. The non-magnetic metal is at least one metal selected from the group consisting of Mg, Al, Si, Ca, Zr, Ti, Hf, Zn, Mn, Ba, Sr, Cr, Mo, Ag, Ga, Sc, V, Y, Nb, Pb, Cu, In, Sn and rare earth elements. These non-magnetic metals advantageously improve the electrical resistance of metal nanoparticles and also the thermal stability and oxidation resistance thereof. In particular, Al and Si advantageously form solid solution with Fe, Co and Ni, main components of the metal nanoparticle, and thus, contribute to improvement of the thermal stability of metal nanoparticles. In particular, use of Al is more preferable, because it leads to improvement in thermal stability and oxidation resistance. The amount of the non-magnetic metals is preferably 0.001 atomic % or more and 20 atomic % or less with respect to the magnetic metals. A content of each non-magnetic metal at more than 20 atomic % may lead to deterioration of the saturation magnetization of magnetic metal nanoparticles. The more preferable amount is in the range of 0.001 atomic % or more and 5 atomic % or less, still more preferably 0.01 atomic % or more and 5 atomic % or less, from the viewpoints of high saturation magnetization and favorable solid solution formation.

The metal nanoparticle more preferably contains carbon and/or nitrogen, independently or coexistently. The amount thereof blended is preferably in the range of 0.001 atomic % or more and 5 atomic % or less, more preferably 0.01 atomic % or more and 5 atomic % or less, with respect to the magnetic metals, from the viewpoint of high saturation magnetization and favorable solid solution formation. At least one of carbon and nitrogen can increase the magnetic anisotropy of magnetic metal nanoparticles by forming solid solution with the magnetic metal. Because the high-frequency magnetic material containing magnetic metal nanoparticles showing such large magnetic anisotropy can increase the ferromagnetic resonance frequency, such a material can retain high magnetic permeability even in a high-frequency band and thus is suitable for use in the high-frequency band.

In particular, in a magnetic metal nanoparticle containing a FeCo-based alloy as the magnetic metal, at least one element selected from Al and Si as the non-magnetic metal and carbon (C), the amount of the at least one element selected from Al and Si blended (total amount if they are copresent) is preferably 0.001 atomic % or more and 5 atomic % or less, more preferably 0.01 atomic % or more and 5 atomic % or less with respect FeCo, and the amount of carbon blended is preferably in the range of 0.001 atomic % or more and 5 atomic % or less, more preferably 0.01 atomic % or more and 5 atomic % or less with respect to FeCo. When it contains a FeCo-based alloy as the magnetic metal, at least one element selected from Al and Si and carbon and the at least one element selected from Al and Si and the carbon are contained in amounts respectively in the range of 0.001 atomic % or more and 5 atomic % or less, it is possible to have favorable magnetic anisotropy and saturation magnetization and thus, to increase the magnetic permeability in the high-frequency range.

Chemical composition analysis of the metal nanoparticle can be carried out easily by TEM-EDX. By the TEM-EDX, approximate composition of the metal nanoparticle can be determined semi-quantitatively by irradiating a focused-beam EDX on a metal nanoparticle. It is additionally possible by XPS to determine the bonding state of each element constituting the metal nanoparticle.

When the metal nanoparticle contains a non-magnetic metal and carbon or nitrogen, at least two of the magnetic metal, the non-magnetic metal and carbon or nitrogen preferably form solid solution with each other. It is possible by solid solution formation to improve magnetic anisotropy and thus to improve high-frequency magnetic characteristics. It also leads to improvement in mechanical properties of the magnetic metal nanoparticle. Specifically if they segregate on the grain boundary or the surface of the magnetic metal particles without solid solution formation, it may become difficult to improve the mechanical properties effectively.

Solid solution formation by at least two of the magnetic metal, the non-magnetic metal and carbon or nitrogen contained in the metal nanoparticle can be determined from the lattice constant obtained by XRD (X-ray diffraction). For example if Fe contained as the magnetic metal, Al contained as the non-magnetic metal and carbon in the magnetic metal particle form a solid solution, the lattice constant of Fe changes according to the amount of solid solution. In the case of bcc-Fe containing no solid solution, the lattice constant is ideally about 2.86, but the lattice constant becomes larger when Al forms solid solution, and the lattice constant increases by about 0.005 to 0.01 when Al forms solid solution in an amount of about 5 atomic %. It increases by about 0.01 to 0.02, when Al forms solid solution in an amount of about 10 atomic %. The lattice constant becomes larger when carbon forms solid solution in bcc-Fe, and increases by about 0.001 when the carbon solid solution formation is about 0.02 wt %. It is possible in this way to determine the lattice constant of the magnetic metal and thus determine the presence of solid solution and the degree of solid solution formation, by XRD measurement of the magnetic metal particle. Formation of solid solution can also be determined also from the particle diffraction pattern obtained under TEM or from high-resolution TEM photography.

The crystal structure of the magnetic metal changes slightly when the particle diameter of the magnetic metal particle becomes smaller and also when the magnetic metal particles and the coat layer form a core-shell structure. It is because distortion is generated at the interface of core and shell when the size of the core magnetic metal becomes smaller or the core-shell structure is formed. The lattice constant should be judged in a comprehensive manner by taking such an effect into consideration. Specifically in the case of a combination of Fe—Al—C, the amounts of Al and C blended is most preferably 0.01 atomic % or more and 5% or less, as described above, and more preferably, they are present as solid solution. The lattice constant of Fe is preferably about 2.86 to 2.90, more preferably about 2.86 to 2.88, as they form solid solution and the particles and the coat layer form core shell structure.

In the case of a combination of FeCo—Al—C, the amount of Co contained in FeCo is most preferably in the range of 20 atomic % or more and 40 atomic % or less and the content of Al and C blended is 0.01 atomic % or more and 5 atomic % or less, and more preferably they are present as solid solution, as described above. When they form solid solution and the particles and the coat layer form a core-shell structure, the lattice constant of FeCo becomes about 2.85 to 2.90, more preferably about 2.85 to 2.88.

The metal nanoparticle may be either polycrystalline or single-crystalline, but it is preferably single-crystalline. It is possible to improve high frequency characteristics more in the case of a single-crystalline magnetic metal nanoparticle than in the case of polycrystalline magnetic metal nanoparticle, because it is easier to orient the axis of easy magnetization and thus to control the magnetic anisotropy.

The metal nanoparticle may be spherical, but may also be in the shape of flat plate or rod having larger aspect ratio. In the case of a metal nanoparticle having a larger aspect ratio, it is more preferable to make the long-side direction of individual metal nanoparticle (width direction in the case of plate-shaped nanoparticle, diameter direction in the case of flat elliptical nanoparticle, rod's length direction in the case of rod-shaped nanoparticle, major axial direction in the case of spheroidal nanoparticle) identical with the long-side direction of entire nanoparticle aggregates (width direction in the case of plate-shaped aggregate, diameter direction in the case of flat elliptical aggregate, rod's length direction in the case of rod-shaped aggregate, major axial direction in the case of spheroidal aggregate). It is possible in this way to orient the axis of easy magnetization to one direction and improve the magnetic permeability and the high frequency characteristics of magnetic permeability.

Preferably, at least part of the surface of the metal nanoparticle is covered with a coat layer. The coat layer is preferably an oxide, composite oxide, nitride or carbide containing at least one of the magnetic metals constituting the metal nanoparticle. The coat layer, when it contains at least one of the magnetic metals constituting the metal nanoparticle, improves adhesion between the metal nanoparticle and the coat layer and thermal stability and oxidation resistance thereof. The coat layer is more preferably an oxide, composite oxide, nitride or carbide containing at least one non-magnetic metal selected from the group consisting of Mg, Al, Si, Ca, Zr, Ti, Hf, Zn, Mn, Ba, Sr, Cr, Mo, Ag, Ga, Sc, V, Y, Nb, Pb, Cu, In, Sn and rare earth elements. When the metal nanoparticle contains at least one non-magnetic metal selected from the group consisting of Mg, Al, Si, Ca, Zr, Ti, Hf, Zn, Mn, Ba, Sr, Cr, Mo, Ag, Ga, Sc, V, Y, Nb, Pb, Cu, In, Sn and rare earth elements, the coat layer more preferably contains an oxide, composite oxide, nitride or carbide containing at least one non-magnetic metal identical with the non-magnetic metal used as a component of the magnetic metal particle. It is possible in this way to improve adhesion between the metal nanoparticle and the coat layer and improve the thermal stability and oxidation resistance of the nanoparticle composite material.

In particular, oxides and composite oxides are more preferable, among the oxides, composite oxides, nitrides or carbides, in the coat layer configuration above. The oxide and composite oxide are preferable from the viewpoints of easiness in preparation of the coat layer, oxidation resistance and thermal stability. The oxide or composite oxide coat layer is an oxide or composite oxide containing at least one magnetic metal constituting the magnetic metal particle and more preferably an oxide or composite oxide containing at least one non-magnetic metal selected from the group consisting of Mg, Al, Si, Ca, Zr, Ti, Hf, Zn, Mn, Ba, Sr, Cr, Mo, Ag, Ga, Sc, V, Y, Nb, Pb, Cu, In, Sn and rare earth elements. The non-magnetic metal is an element having a lower standard Gibbs energy of formation of oxide that is resistant to oxidation and forms a stabilized oxide easily. Such an oxide coat layer containing an oxide or composite oxide containing at least one non-magnetic metal improves the adhesiveness and bonding efficiency to metal nanoparticle and the thermal stability and oxidation resistance of the metal nanoparticle.

Among non-magnetic metals, Al and Si are preferable, because these elements easily form solid solution with Fe, Co or Ni which is a main component of the magnetic metal particle, and thus, contribute to improvement of the thermal stability of the metal nanoparticle. The composite oxides of metals containing multiple non-magnetic metals include those in the state of solid solution.

In the present embodiment, the coat layer covering at least part of the surface of the metal nanoparticle improves the oxidation resistance of the internal metal nanoparticle and also improves the electrical resistance of the material by electrically isolating the metal nanoparticles from each other, during preparation of a desired material, as they are integrated. It is possible to suppress the eddy current loss at high frequency and improve the high frequency characteristics of magnetic permeability by increasing the electrical resistance of the material. Thus, the coat layer is preferably highly resistant electrically and preferably has, for example, a resistance of 1 mΩ·cm or more. The nanoparticle aggregate has a larger electrical resistance and the thermal stability and the oxidation resistance of the metal nanoparticle become higher, when the coat layer becomes thicker. However, when the coat layer is excessively thick, magnetic coupling between metal nanoparticles can easily be broken and individual metal nanoparticles easily behave independently magnetically, and for that reason, an excessively thick coat layer is unfavorable from the viewpoints of magnetic permeability and high frequency characteristics of magnetic permeability. In addition, because the ratio of the magnetic component in the nanoparticle aggregate decreases when the coat layer becomes thicker, the saturation magnetization and the magnetic permeability of the nanoparticle aggregate declines, and thus, excessively thick coat layer is unfavorable. The coat layer more preferably has an average thickness of 0.1 nm or more and 5 nm or less, to make the electrical resistance larger to some extent and to make the saturation magnetization of the nanoparticle aggregate larger by bonding individual metal nanoparticles to each other magnetically.

The average interparticle distance between the metal nanoparticles is preferably 0.1 nm or more and 10 nm or less, more preferably 0.1 nm or more and 5 nm or less. The interparticle distance herein is the distance of the opening between two nanoparticles on the line extending from the center of one nanoparticle to the center of another nanoparticle. When the surface of the metal nanoparticle is covered with a coat layer, the interparticle distance is a distance between the outermost surface of the surface coat layer of one nanoparticle to that of another nanoparticle. It is possible in this way to make the metal nanoparticles bind to each other magnetically, making them behave like a nanoparticle aggregate and to increase the magnetic permeability. In addition, because the particles are not bound completely to each other physically, it is possible to reduce microscopic eddy current loss and improve high frequency characteristics of magnetic permeability. Such an effect is not observed when the aggregate is in a simple shape having a large aspect ratio, and it is an effect observed only when the nanoparticle aggregates are separated physically, but bound to each other magnetically.

The nanoparticle aggregate preferably contains a metal, semiconductor, oxide, nitride or carbide containing at least one non-magnetic metal selected from Mg, Al, Si, Ca, Zr, Ti, Hf, Zn, Mn, Ba, Sr, Cr, Mo, Ag, Ga, Sc, V, Y, Nb, Pb, Cu, In, Sn and rare earth elements between the metal nanoparticles. Then, the metal, semiconductor, oxide, nitride or carbide preferably has a resistivity of 1 mΩ·cm or more. The metal, semiconductor, oxide, nitride or carbide containing such a non-magnetic metal is preferable, because it can improve the electrical insulation and the thermal stability of the metal nanoparticles, if present between metal nanoparticles. The metal, semiconductor, oxide, nitride or carbide preferably contains at least one of the magnetic metals. The metal, semiconductor, oxide, nitride or carbide, when it contains at least one metal identical with the magnetic metals contained in the metal nanoparticle, improves thermal stability and oxidation resistance. In addition, the presence of a ferromagnetic component between metal nanoparticles is preferable, because it strengthens magnetic coupling between metal nanoparticles, making the nanoparticles behave like an aggregate magnetically and also from the viewpoints of magnetic permeability and high frequency characteristics of magnetic permeability.

The oxide, nitride or carbide preferably contains particles smaller in particle diameter than the metal nanoparticles. Then, the particle may be an oxide particle, a nitride particle or a carbide particle, but it is more preferably an oxide particle, from the viewpoint of thermal stability (hereinafter, the present invention will be explained, as the particles are all oxide particles). The oxide particles are more preferably present in the state dispersed uniformly and homogeneously between magnetic metal particles. Accordingly, more uniform magnetic characteristics and dielectric properties can be expected. The oxide particle can improve the oxidation resistance, aggregation resistance of magnetic metal particles, i.e., thermal stability of the magnetic metal particle, similarly to the coat layer, and also separate the metal nanoparticles electrically from each other in preparation of a desired material by integration of metal nanoparticles covered by the coat layer and thus, increase the electrical resistance of the material. It is possible to reduce the eddy current loss at high frequency and improve high frequency characteristics of magnetic permeability by increasing the electrical resistance of the material.

Thus, the oxide particle preferably has a high electrical resistance, for example, of 1 mΩ·cm or more.

The oxide particle contains at least one non-magnetic metal selected from the group consisting of Mg, Al, Si, Ca, Zr, Ti, Hf, Zn, Mn, Ba, Sr, Cr, Mo, Ag, Ga, Sc, V, Y, Nb, Pb, Cu, In, Sn and rare-earth metal elements. These non-magnetic metals are oxidation-resistant elements having a low standard Gibbs energy of oxide formation and give stable oxides easily. The ratio of non-magnetic metal/magnetic metal (atomic ratio) in the oxide particle is greater than the ratio of non-magnetic metal/magnetic metal (atomic ratio) in the coat layer covering the metal nanoparticle. In such a state, the oxide particle is more thermally stable than the coat layer, because it has a higher ratio of non-magnetic metals. Thus, it is possible to improve the electrical insulation between metal nanoparticles and the thermal stability of the metal nanoparticles by the presence of the oxide particles at least part of the space between metal nanoparticles.

The oxide particle may not contain a magnetic metal, but more preferably, it contains a magnetic metal. The preferable amount of the magnetic metal contained is 0.001 atomic % or more, preferably 0.01 atomic % or more, with respect to the non-magnetic metals. It is because the coat layer coating the surface of the magnetic metal particle and the components constituting the oxide particle are separated completely in the absence of the magnetic metal and such a state is unfavorable from the points of adhesion and strength, and additionally, the thermal stability may also be damaged. The complete absence of magnetic metal in the oxide particles that are present between metal nanoparticle is unfavorable, because it leads to magnetic uncoupling of metal nanoparticles and also from the viewpoints of magnetic permeability and high frequency characteristics of magnetic permeability. Thus more preferably, the oxide particle is a component constituting the metal nanoparticle and contains at least one of the magnetic metals constituting the oxide coat layer, and yet more preferably, the ratio of non-magnetic metal/magnetic metal in the oxide particle (atomic ratio) is greater than the ratio of non-magnetic metal/magnetic metal (atomic ratio) in the oxide coat layer. The oxide particle is preferably an oxide particle containing non-magnetic metals similar in kind to the non-magnetic metals contained in the metal nanoparticle or the non-magnetic metals contained in the oxide coat layer. It is because the thermal stability and the oxidation resistance of the metal nanoparticle increased more by the presence of an oxide particle containing non-magnetic metals similar in kind.

The effect of improving of thermal stability, electrical insulation, adhesion and strength of the oxide particle described above are particularly effective when the average diameter of the magnetic metal particles is smaller, and particularly effective when the particle diameter thereof is smaller than the particle diameter of the metal nanoparticles.

The nanoparticle composite material preferably contains the nanoparticle aggregates and a resin.

Examples of the resins for use include, but are not particularly limited to, polyester resins, polyethylene resins, polystyrene resins, polyvinyl chloride resins, polyvinylbutyral resins, polyvinylalcohol resins, polybutadiene resins, polytetrafluoroethylene resins (Teflon [trademark]), polyurethane resins, cellulosic resins, ABS resins, nitrile-butadiene rubbers, styrene-butadiene rubbers, silicone rubbers, other synthetic rubbers, natural rubbers, epoxy resins, phenol resins, amide resins, imide resins, or the copolymers thereof.

More preferably, it contains at least one resin selected from polyvinylalcohol (PVA) resins, polyvinylbutyral (PVB) resins, epoxy resins, polybutadiene resins, Teflon resins and polystyrene resins. The oxygen permeability of the resin then is preferably 10,000 cc/m$^2$·24 hr·atm (thickness: 30 μm, 25° C., 90% RH) or less. The oxygen permeability of a resin in the above range is favorable for keeping the oxidation resistance of the nanoparticle aggregate high and also from the points of thermal stability, oxidation resistance and environment resistance.

The volume ratio of the resin in the entire nanoparticle composite material is desirably 80% or less. A volume ratio of the resin of more than 80% is unfavorable, because it leads to decrease of the ratio of nanoparticle aggregates contained in the entire material, consequently leading to decrease in saturation magnetization and magnetic permeability of the nanoparticle composite material.

The resin more desirably contains a resin A and also a resin B different from resin A. Examples of resins A and B include polyvinylbutyral resins, polyvinylalcohol resins, epoxy resins, polybutadiene resins, Teflon resins, polystyrene resins, polyester resins, polyethylene resins, polyvinyl chloride resins, polyurethane resins, cellulosic resins, ABS resins, nitrile-butadiene rubbers, styrene-butadiene rubbers, phenol resins, amide resins, imide resins, or the copolymers thereof.

Favorable moldability, heat resistance of 85° C. or higher and a low dielectric constant and low dielectric loss at high frequency are demanded for resin A. (But the dielectric constant varies according to the device used. Generally, a low dielectric constant is preferable, but for use as an ultrasmall antenna board for example, a high dielectric constant is preferable, because it permits reduction in size by its wavelength reduction effect. A low dielectric constant is preferable for example for use as a broadband antenna board. Thus, a resin having a dielectric constant suitable for the device used should be selected. Hereinafter, the embodiment will be described assuming that the device is used as a device demanding a low dielectric constant.)

High heat resistance, low oxygen permeability, low steam permeability and low hygroscopicity are demanded for resin B, because an action as a protective film for prevention of oxidative degradation of nanoparticle aggregates is demanded. In particular, the oxygen permeability should be 10,000 cc/m$^2$·24 hr·atm (thickness: 30 μm, 25° C., 90% RH) or less. When the oxygen permeability is more than 10,000 cc/m$^2$·24 hr·atm (thickness: 30 μm, 25° C., 90% RH), oxygen permeates the film and oxidizes the internal nanoparticle aggregates, leading to deterioration in magnetic permeability.

In addition, the dielectric constant and the dielectric loss at high frequency of both resins A and B are preferably lower. Specifically, the dielectric constant is preferably 50 or less, more preferably 20 or less and the dielectric loss is preferably 20% or less, more preferably 10% or less. Because a high dielectric constant and dielectric loss lead to deterioration of the antenna characteristics at high frequency, they are preferably as small as possible. Preferably from the viewpoints above, resin A for use is a PVB, PVA, epoxy resin, polybutadiene resin, Teflon resin or polystyrene resin, while resin B for use is a PVB, epoxy or Teflon resin.

Resin B is introduced in or on the surface of a sheet or pellet containing resin A and nanoparticle aggregates, by impregnation of resin B in or on the surface thereof. The sheet and pellet containing only nanoparticle aggregates and resin A has pores therein. When formed in a film shape in the open pores and on the surface, resin B shows an effect as a protective film. Impregnation under vacuum is more effective, because it accelerates penetration of resin B into the internal pores. Although the main component of the surface film is resin B, the nanoparticle aggregates and resins A and B are present in the internal region other than the film.

Resins A and B desirably occupy together a volume ratio of 5% or more and 80% or less. A volume ratio of less than 5% may lead to deterioration in strength as a sheet, because the nanoparticle aggregates are not bound to each other. A volume ratio of more than 80% may lead to decrease of the volume ratio of the nanoparticle aggregates in sheet and thus to decrease in magnetic permeability.

The volume ratio of resin A is needed to be 50% or less and the volume ratio of resin B is needed to be smaller than that of resin A and preferably 1% or more and 30% or less. If volume ratio of a resin is more than 50%, reduction of the total volume ratio of resin A and resin B can not be realized to 80% or less, consequently leading to deterioration of the volume fraction of the nanoparticle aggregates.

When the amount of resin B is less than 1%, its protective effect is insufficient, while, when it is 30% or more, it leads to deterioration of the volume fraction of the nanoparticle aggregates. In the case of a film containing resin B as the main component, the thickness is desirably 1 µm or more. It is because, when it is 1 µm or less, the film does not have an effect sufficient as a protective film.

An inorganic material such as oxide, nitride or carbide may be used, replacing the resin. Specific examples of the inorganic material include an oxide containing at least one metal selected from the group consisting of Mg, Al, Si, Ca, Zr, Ti, Hf, Zn, Mn, rare earth elements, Ba and Sr, and the like.

The nanoparticle composite material preferably contains, in addition to the nanoparticle aggregates, oxide-, nitride- or carbide-inclusion particles. Then, the inclusion particles may be oxide particles, nitride particles or carbide particles, but more preferably oxide particles from the viewpoint of thermal stability (hereinafter, the embodiment will be described assuming that the particles are oxide-inclusion particles). Then, the oxide-inclusion particle preferably contains at least one magnetic metal contained in the metal nanoparticle described above. If there are a coat layer and oxide (or nitride or carbide) particles on the surface of the metal nanoparticles, at least ones of the magnetic metals contained respectively in the metal nanoparticles, the coat layer, the oxide (or nitride or carbide) particles and the oxide-inclusion particle are identical. Similarly, at least ones of the non-magnetic magnetic metals respectively contained in the metal nanoparticles, the coat layer, the oxide (or nitride or carbide) particles and the oxide-inclusion particles are the same. It is because it is possible to improve thermal stability and oxidation resistance, when the metal nanoparticles, the coat layer, the oxide (or nitride or carbide) particles and the oxide-inclusion particles respectively contain the same magnetic metals and the same non-magnetic metals. It is also possible to expect improvement in magnetic permeability and high frequency characteristics of magnetic permeability, when the oxide-inclusion particles contain a magnetic metal, because the magnetic coupling between nanoparticle aggregates is strengthened.

The non-magnetic metal/magnetic metal ratio (atomic ratio) of the oxide-inclusion particle is desirably higher than the non-magnetic metal/magnetic metal ratio (atomic ratio) in the coat layer covering the metal nanoparticle. In addition, the non-magnetic metal/magnetic metal ratio (atomic ratio) of the oxide-inclusion particle is desirably higher than the non-magnetic metal/magnetic metal ratio (atomic ratio) of the metal, semiconductor, oxide, nitride or carbide contained in the nanoparticle aggregate. It is because it is possible to improve the thermal stability and the oxidation resistance of the nanoparticle aggregate.

The oxide-inclusion particles desirably have an average diameter of 1 nm or more and 100 nm or less. The volume of the oxide-inclusion particles contained is desirably 0.01 vol % or more and 30 vol % or less with respect to the total volume of the metal nanoparticles, the coat layer, the oxide-inclusion particles and the oxide particles. The oxide-inclusion particles contained in such a range improve the electrical insulation, reduce the eddy current loss effectively and improve the high-frequency magnetic characteristics of the nanoparticle aggregates during integration. It is also possible advantageously to improve the thermal stability and the oxidation resistance of the nanoparticle aggregates.

In the present embodiment, the volume ratio of the nanoparticle aggregates in the nanoparticle composite material is desirably 10% or more and 70% or less by volume, with respect to the entire nanoparticle composite material, for more excellent properties. A volume ratio of more than 70% may lead to decrease in the electrical resistance, increase in the eddy current loss and deterioration in the high-frequency magnetic characteristics of the nanoparticle composite material. A volume ratio of less than 10% may lead to decrease of the volume fraction of the magnetic metal and thus to deterioration in saturation magnetization of the nanoparticle composite material and deterioration in magnetic permeability thereby.

Also in the present embodiment, the composition, the film thickness and the particle diameter respectively of the individual metal nanoparticles, the coat layer, the oxide particles (or nitride or carbide particles) and the oxide-inclusion particles (or nitride or carbide particles) are desirably formed uniformly for more excellent properties.

The chemical composition of the metal nanoparticles, the coat layer, the oxide particles (or nitride or carbide particles) and the oxide-inclusion particles (or nitride or carbide particles) is analyzed, for example, by a method such as TEM-EDX, XPS or SIMS. In particular, it is possible to determine the composition of each component easily by TEM-EDX, specifically by irradiating each component with focused-beam EDX and determining the composition semi-quantitatively. The volume ratio of the oxide-inclusion particles (or nitride or carbide particles) or the nanoparticle aggregates can be determined by TEM-EDX analysis or SEM-EDX analysis, and the volume ratio can also be calculated simply from the average diameter of the oxide particles, average dimension of the nanoparticle aggregates (average height and average length) and the ratio of the numbers of nanoparticle aggregate to those of oxide particles obtained by TEM or SEM observation.

The nanoparticle composite material in the present embodiment may be, for example, in the shape of powder, bulk (pellet, ring, or rectangular shape), film such as sheet or the like.

The production method for the magnetic sheet of nanoparticle composite material is not particularly limited, but it can be prepared, for example, by preparing a slurry by mixing nanoparticle aggregates, a resin and a solvent, coating the slurry and drying the resulting film. A mixture of nanoparticle aggregates and a resin may be pressed into a sheet-shaped or pellet-shaped molding. Yet, the nanoparticle aggregate may be deposited, as dispersed in a solvent, by a method such as electrophoresis. During sheet formation, it is desirable to orient the nanoparticle aggregates unidirectionally (in the direction in which the longitudinal directions of individual nanoparticle aggregates are identical with each other). It favorably improves the magnetic permeability and the high frequency characteristics of magnetic permeability of the nanoparticle composite material sheet containing the nanoparticle aggregates. The means for orientation is not particularly limited, but may be, for example, coating and drying in an applied magnetic field. The nanoparticle aggregate in the present embodiment has an axis of easy magnetization oriented in the longitudinal direction, because internal individual magnetic metal nanoparticles are magnetically coupled and the nanoparticle aggregate has a large aspect ratio. It is thus possible to orient them relatively easily in magnetic field. In addition, because the nanoparticle aggregates have a large aspect ratio, these aggregates can be oriented to some extent only by coating and drying without application of magnetic field.

The magnetic sheet may have a laminate structure. It is possible to form a thick film easily in the laminated structure and also to improve the high-frequency magnetic characteristics by laminating it with a non-magnetic insulating layer alternately. It is thus possible to improve high-frequency magnetic characteristics by forming a film having a laminate structure by means of forming a sheet-shaped magnetic layer containing nanoparticle aggregates having a thickness of 100 μm or less, and laminating the sheet-shaped magnetic layer with a non-magnetic insulating oxide layer having a thickness of 100 μm or less alternately. It is possible, by making the thickness of the single magnetic layer not more than 100 μm, to reduce the influence of demagnetizing field and raise the magnetic permeability when a high-frequency magnetic field is applied in the in-plane direction and also to improve the high frequency characteristics of magnetic permeability. The lamination method is not particularly limited, but multiple magnetic sheets above may be pressed as they are piled or laminated by heating and sintering.

In the nanoparticle composite material of the present embodiment, the material structure can be determined (analyzed), for example, by scanning electron microscopy (SEM) or transmission electron microscopy (TEM); the diffraction pattern (including confirmation of solid solution) can be determined by TEM diffraction or X-ray diffraction (XRD); and the identification and quantitative analysis of the constituent elements can be carried out by inductively coupled plasma (ICP), emission analysis, fluorescence X-ray analysis, electron probe micro-analysis (EPMA), energy dispersive X-ray (EDX) fluorescence spectrometer, secondary ion mass spectrometry (SIMS) or the like.

The average diameter of each constituent component can be calculated by determining the average of the longest diagonal length and the shortest diagonal length of individual particle as its particle diameter by TEM or SEM observation and obtaining the average of multiple particle diameters thus obtained. The average diameter of the magnetic metal nanoparticles may be replaced with the crystalline grain size, as determined by XRD measurement, if it cannot be determined easily by TEM. Thus, it can be calculated according to the Sherrer's Formula from the diffraction angle and the half value width of the strongest peak in the peaks derived form magnetic metal nanoparticle observed by XRD. The Sherrer's Formula is expressed by:

$D=0.9\lambda/(\beta \cos \theta)$, where, D represents the crystal grain diameter; λ represents the X-ray wavelength used for measurement; β represents the half value width; and θ represents the diffraction Bragg angle. The dimension and the aspect ratio of the nanoparticle aggregates are determined by analyzing multiple nanoparticle aggregates in the image thereof under TEM or SEM and calculating the average. The film thickness of the coat layer can be determined by TEM observation. The volume ratio of the oxide-inclusion particles (or nitride or carbide particles) or the nanoparticle aggregates can be determined by TEM-EDX analysis or SEM-EDX analysis; and the volume ratio can be calculated simply from the average diameter of the oxide particles and the average dimension (average height and average length) of the nanoparticle aggregates and the ratio of numbers of the nanoparticle aggregates to those of oxide particles, as determined by TEM or SEM observation.

Two or more nanoparticle aggregates may bind to each other in the process of producing the nanoparticle composite material. Even in such a case, when a boundary line is drawn between the nanoparticle aggregates, if one nanoparticle aggregate divided by the boundary line has an average height of 20 nm or more and 2 μm or less and an average aspect ratio of 5 or more, it is accepted as a nanoparticle aggregate. There is also a case where one nanoparticle aggregate is bound to part of another nanoparticle aggregate. Also in such a case, if the condition described above is satisfied when a boundary line is drawn between one nanoparticle aggregate and part of another nanoparticle aggregate, it is accepted as the nanoparticle aggregate in the shape in which one nanoparticle aggregate is bound to part of another nanoparticle aggregate. Yet, it may be an irregular-shaped nanoparticle aggregate other than the plate-shaped, flat elliptical, rod-shaped and spheroidal aggregates exemplified above. However, if the ratio of the longest diameter to the length in the direction perpendicular thereto (aspect ratio) is 5 or more and the length in the direction perpendicular to the longest diameter (height) is 20 nm or more and 2 μm or less, it is accepted as the irregular-shaped nanoparticle aggregate.

When the material other than metal nanoparticles contained in nanoparticle aggregate is the same as that surrounding the nanoparticle aggregate, the outer edge of the nanoparticle aggregate is unclear and hardly recognizable. In such a case too, nanoparticle aggregates having an average height of 20 nm or more and 2 μm or less and having an average aspect ratio of 5 or more, formed by aggregation and segregation of magnetic metal nanoparticles in a material can also be accepted as the nanoparticle aggregates, if recognized by structural observation under TEM or SEM. As described above, because the effect in the embodiment is obtained if the distance between the metal nanoparticles contained in the nanoparticle aggregate is 10 nm or less, the distance between the metal nanoparticles that are present as aggregated and segregated should be 10 nm or less.

In the case of the nanoparticle aggregate binding to two or more nanoparticle aggregates or one nanoparticle aggregate binding to part of another nanoparticle aggregate and also in the case of an irregular-shaped nanoparticle aggregate other than the plate-shaped, flat elliptical, rod-shaped and spheroidal aggregates, if the height and the aspect ratio obtained by drawing a boundary line satisfy the requirements above, it is accepted as the nanoparticle aggregate. For example, the boundary line is drawn at a site where the average interparticle distance between a metal nanoparticle and another metal nanoparticle present in the neighborhood is 10 nm or more, preferably 100 nm or more. However, it is one method, and in practice, it is preferable that the region containing magnetic metal nanoparticles in a relatively larger amount than the surrounding area is determined in a common-sense range by structural observation under TEM or SEM and the boundary line is drawn as a nanoparticle aggregate.

In the configuration above, it is possible to provide a nanoparticle composite material having excellent properties in a high-frequency band, particularly in the gigahertz band range. Specifically, it is possible to obtain high magnetic permeability (high μ' and low μ") and high insulation in a desired high-frequency band and to provide, for example, a magnetic material suitable for antenna devices that has a transmission loss lowered as much as possible. It is also possible to provide a magnetic material superior in absorption characteristics and thus, suitable as a wave absorber for the signal in part of a higher frequency band region. In addition, a magnetic material superior in thermal stability of its magnetic characteristics for an extended period of time is provided.

It is also possible in the first embodiment to bring the µ" peak (resonance frequency) to high frequency and thus, to use the magnetic material as an electromagnetic wave absorber for the signal in the frequency band around the µ" peak.

Second Embodiment

The device apparatus in the present embodiment is a high-frequency apparatus containing the nanoparticle composite material in the configuration of the first embodiment. Thus, description in duplication with that of the first embodiment will be omitted. The device apparatus is, for example, a high-frequency magnetic part such as an inductor, choke coil, filter or transformer, or a wave absorber.

The nanoparticle composite material may be subjected to various processings before application to the devices. For example in the case of a sintered material, it is machine-processed such as polishing or cutting, while in the case of a powder, it is mixed with a resin such as epoxy resin or polybutadiene resin. It is additionally surface-treated as needed. When the high-frequency magnetic component is an inductor, choke coil, filter or transformer, it is subjected to winding treatment.

The device in the present embodiment is a device superior in properties particularly in the gigahertz band range.

Third Embodiment

The antenna device in the present embodiment is an antenna device containing the nanoparticle composite material in of the first embodiment. Thus, description in duplication with that of the first embodiment will be omitted. The antenna device in the present embodiment has a feeder terminal, an antenna element connected to the feeder terminal at one terminal, and a nanoparticle composite material for reduction of the transmission loss of the electromagnetic signal radiated from the antenna element.

FIGS. 2A and 2B are views showing configurations of the antenna device in the present embodiment. FIG. 2A is a perspective view, while FIG. 2B is a cross-sectional view of FIG. 2A along line A-A. A nanoparticle composite material 16 is formed between two antenna elements 14 aligned linearly, as they are connected to a feeder point 22 at the terminal, and a circuit board 8. The antenna element 14 and the nanoparticle composite material 16 are drawn separated in FIG. 2B to make the configuration of the antenna device more easily recognizable. However, the antenna element 14 and the nanoparticle composite material 16 are in contact with each other. A configuration of the antenna element 14 and the nanoparticle composite material 16 being separated is also accepted.

The circuit board 8 is, for example, a circuit board for portable devices and enclosed, for example, by a metal case.

For example when the antenna of a portable device radiates an electromagnetic signal, if the antenna element 14 is brought closer to a metal such as the case of the portable device to a certain degree or more, the inductive current is generated in the metal, inhibiting radiation of the electromagnetic signal. However, when a nanoparticle composite material 16 is placed in the area close to the antenna element 14, even if the antenna element 14 is brought closer to a metal such as the case, the inductive current is not generated, leading to stabilization of the radio signal communication and reduction in size of the portable device.

As in the present embodiment, it is possible to suppress the inductive current generated on the circuit board 8 when the antenna element 14 radiates an electromagnetic signal and improve the radiation efficiency of the antenna device, by inserting a nanoparticle composite material 16 between the two antenna elements 14 having a feeder point 22 therebetween and the circuit board 8.

Fourth Embodiment

Figure 3A:
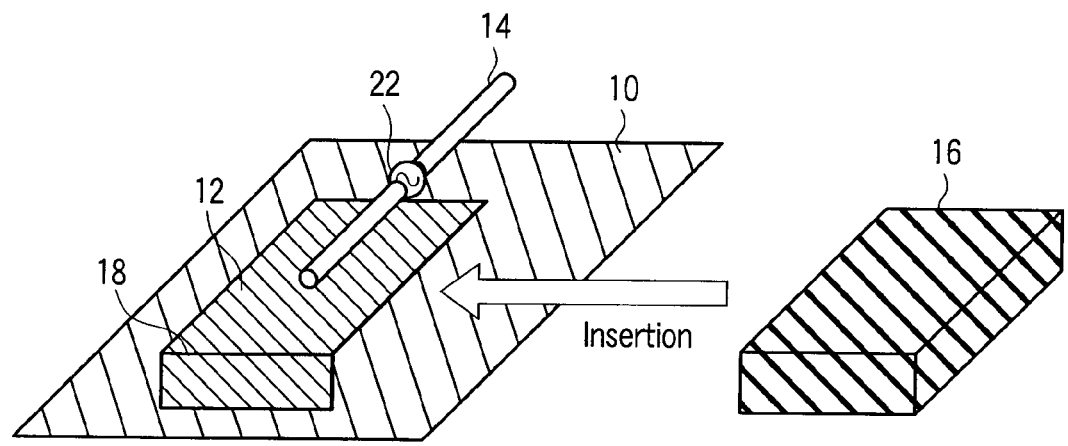
FIGS. 3A, 3B and 3C are views showing configurations of an antenna device of a fourth embodiment.
Figure 3B:
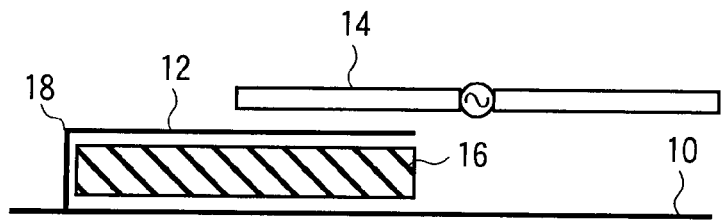
Figure 3C:
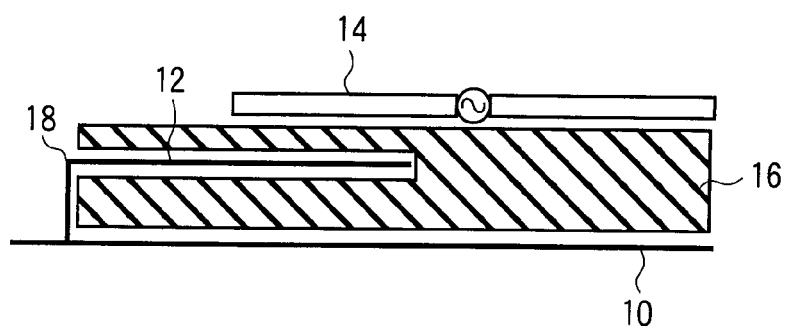

The antenna device in the present embodiment is an antenna device having the nanoparticle composite material in of the first embodiment. FIGS. 3A to 3C are views showing configurations of the antenna device described in the present embodiment. FIG. 3A is a perspective view; FIG. 3B is a cross-sectional view; and FIG. 3C is a cross-sectional view of a modified example (modification example 1) of the apparatus described in the fourth embodiment.

As shown in FIG. 3A, the antenna device comprises a finite ground plate 10, a rectangular conductive plate 12 provided above the finite ground plate 10, antenna elements 14 placed above the finite ground plate 10 almost in parallel with the finite ground plate 10, and a nanoparticle composite material 16 placed in at least part of the space between the finite ground plate 10 and the antenna element 14.

The rectangular conductive plate 12 is formed above the finite ground plate 10; one side thereof is connected to the finite ground plate 10 and it comprises a bend almost parallel with the side. The two antenna elements 14 are placed above the finite ground plate 10 almost in parallel with the finite ground plate 10. In addition, the two antenna elements 14 extend in the direction almost perpendicular to one side of the rectangular conductive plate 12 connected to the finite ground plate 10. The two antenna elements 14 are aligned linearly and one antenna 14 is formed above the rectangular conductive plate 14. A feeder point 22 is formed between the two antenna elements 14. The feeder point 22 is located at a position close to the side opposite to the side of the rectangular conductive plate 12 described above. A nanoparticle composite material 16 may be inserted into at least part of the space between the finite ground plate 10 and the antenna element 14. The nanoparticle composite material 16 is the nanoparticle composite material described in the first embodiment. Thus, description in duplication with that of the first embodiment will be omitted.

The term "above" is an expression showing the position relative to the finite ground plate 10 placed at the bottom, and does not always indicate that a material is placed upward in the vertical direction. The term "above" is also used, when the two component are in contact with each other.

In FIG. 3, a nanoparticle composite material 16 is configured to be inserted into the space between the finite ground plate 10 and the rectangular conductive plate 12. In FIG. 3A, the nanoparticle composite material 16 is shown, as it is separated from the antenna device, to make the configuration of the antenna device more recognizable.

Also in FIG. 3B, the nanoparticle composite material 16 is shown, as it forms a space between the finite ground plate 10 and the rectangular conductive plate 12. However, it is desirable to bring the nanoparticle composite material 16 into contact with the finite ground plate 10 and the rectangular conductive plate 12, eliminating the space, for increase the effects of inserting the nanoparticle composite material 16. In addition, although the nanoparticle composite material 16 is inserted only into the space between the rectangular conductive plate 12 and the finite ground plate in FIG. 3B, as shown in the modified embodiment 1 of FIG. 3C, it may be inserted into the space with part of it extending out of the rectangular conductive plate 12 and the other part of it being inserted into the space between the antenna element 14 and the rectangular conductive plate 12.

Other materials may be needed to be installed in respective spaces for adhesion of the nanoparticle composite material 16 with the finite ground plate 10, the rectangular conductive plate 12 and the antenna element 14. In such a case, the space between the finite ground plate 10 and the antenna element 14 other than the space of the nanoparticle composite material 16 is filled with a dielectric material. A dielectric material having a refractive index identical with that of the nanoparticle composite material is preferably selected as the dielectric material.

A radio signal is reflected on the interface between the nanoparticle composite material 16 and air when the nanoparticle composite material 16 is used alone without a dielectric material, while it is reflected by the interface between the nanoparticle composite material 16 and the dielectric material when a nanoparticle composite material 16 and a dielectric material different in refractive index are formed. Thus, loss of the nanoparticle composite material 16 or the dielectric material, if present, causes deterioration of the radiation efficiency of the antenna device, while no loss thereof also causes restriction of the band used by the antenna device. It is possible to reduce undesirable radio signal reflection and thus, to prevent decrease of radiation efficiency by making the refractive index of the space consistent.

Both the finite ground plate 10 and the rectangular conductive plate 12 are made of a conductive material. One side of the rectangular conductive plate 12 is connected to the finite ground plate 10, thus in the electrically short-circuited state. The rectangular conductive plate 12 comprises a bend 18 almost in parallel with the one side.

The bend 18 of the rectangular conductive plate 12 may be formed by bending the rectangular conductive plate or, if electrically equivalent, two rectangular conductive plate may be connected physically, electrically to each other, for example, by a method such as soldering, replacing bending. In the antenna device shown in FIG. 3, the angle of the bend 18 of the rectangular conductive plate 12 is a right angle and thus, the plate has a region in parallel with the finite ground plate 10 and also a region perpendicular thereto. However, the structure is not essential, and it needs not to have such a structure in particular, if electromagnetic signal propagation is possible below the rectangular conductive plate 10. It is also not essential to make the rectangular conductive plate 12 bent at right angles or to form a region in parallel with or perpendicular to the finite ground plate 10.

The phrase that the feeder point 22 of the antenna element 14 is located at a position close the side opposite to the one side of the rectangular conductive plate 12 means the position of the feeder point 22 is located, as separated from the other side, in the range of one sixth or less of the wavelength from the operation frequency of the antenna element 14. It is for antenna matching, as will be described below.

In the dipole antenna shown in FIG. 3, power is supplied between the two linear conductive materials aligned linearly.

Figure 4:
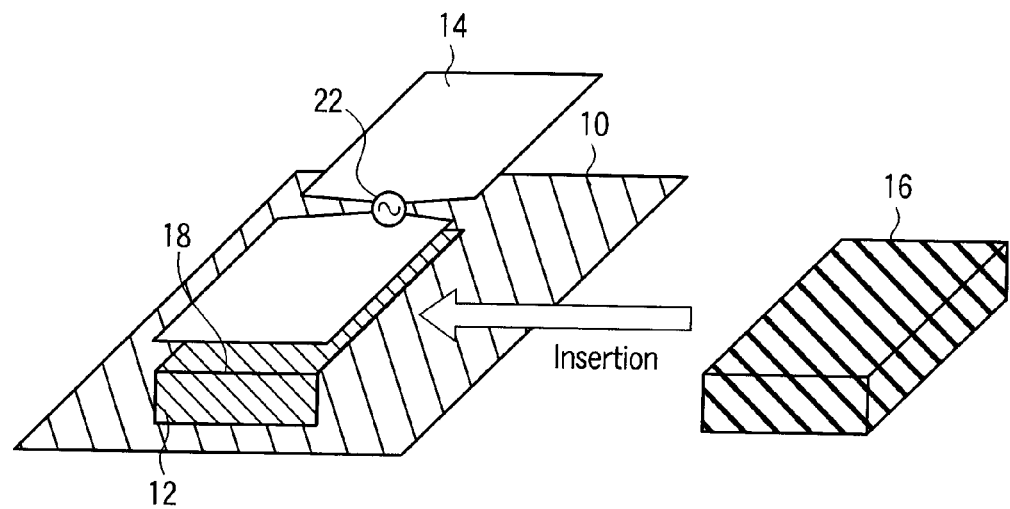
FIG. 4 is a view showing a configuration of a first modified example of the antenna device of the fourth embodiment.

The FIG. 4 is a view showing a modified example of the antenna device in the present embodiment (modification example 2). In the modified example, a plate-shaped dipole antenna is used as the antenna element 14. The plate-shaped dipole antenna comprises two conductive plates 10 and a feeder point 22 placed at the center. The side of each conductive plate 10 closer to the feeder point 22 was obliquely processed in such a manner that the gap between the two conductive plates expands as the side is separated from the feeder point 22. Thus, the sides of respective conductive plates 10 has a dogleg shape at the area closer to the feeder point 22. The plate-shaped dipole antenna is advantageous in that it can obtain more broadband characteristics than dipole antenna using the linear antenna such as that shown in FIG. 3.

Figure 5A:
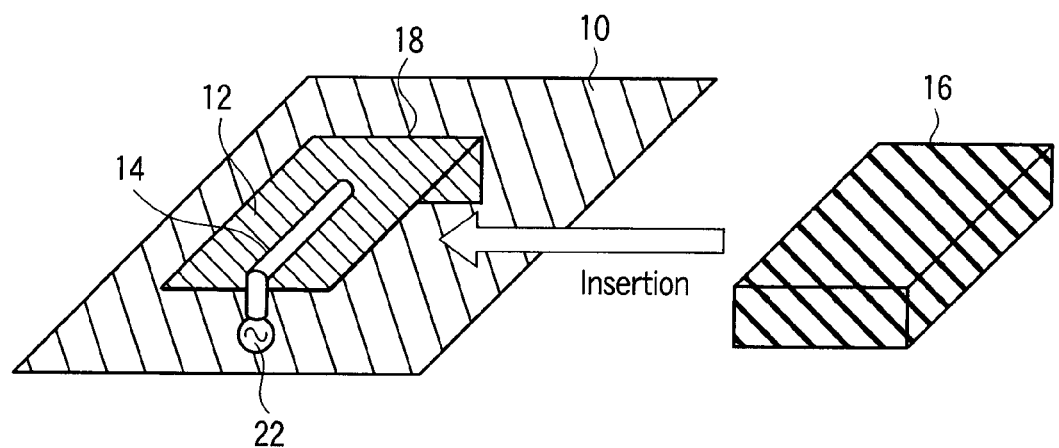
FIGS. 5A, 5B and 5C are views showing configurations of a second modified example of the antenna device of the fourth embodiment.
Figure 5B:
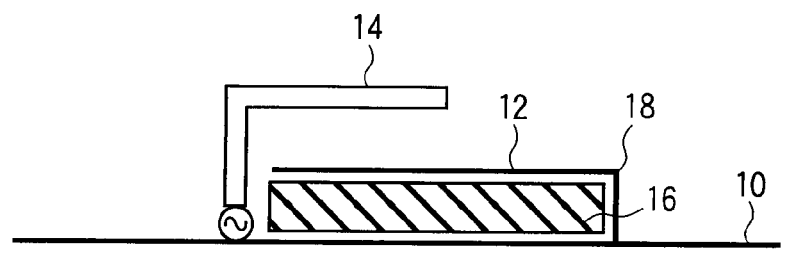
Figure 5C:
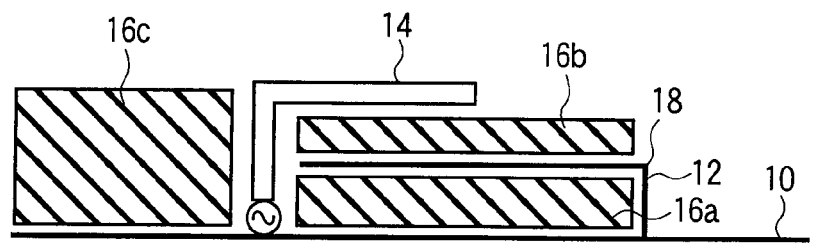

FIGS. 5A to 5C are views showing configurations in other modified examples of the antenna device in the present embodiment (modification examples 3 and 4). FIG. 5A is a perspective view of the modification example 3; FIG. 5B is a cross-sectional view of the FIG. 5A; and FIG. 5C is a cross-sectional view of the modification example 4. In these modification examples, a monopole antenna having an antenna element 14 at the feeder point 22 is used as the antenna element 14. In contrast to the dipole antenna shown in FIG. 3, the antenna element 14 does not have the antenna element 14 farther from the rectangular conductive plate 12. In addition, the feeder point 22 is located on the finite ground plate 10 and the antenna element 14 is bent at one end of the feeder point 22.

In FIG. 5A, the nanoparticle composite material 16 is shown, as separated from the antenna device to make it more easily recognized. The nanoparticle composite material 16 is inserted into at least part of the space between the antenna element 14 and the rectangular conductive plate 12, for example, between the rectangular conductive plate 12 and the finite ground plate 10.

FIG. 5C show a monopole antenna device, in which the magnetic material is placed, not only in the inner space surrounded by the finite ground plate 10, the rectangular conductive plate 12 and the antenna element (nanoparticle composite material 16a), but also in the space above the rectangular conductive plate 12 and below the antenna element 14 (nanoparticle composite material 16b) and, a space facing the rectangular conductive plate 12 via the antenna element 14 (nanoparticle composite material 16c). In FIGS. 5A to 5C, the nanoparticle composite material 16a to 16c are shown, as separated respectively from the finite ground plate 10, the rectangular conductive plate 12 and the antenna element 14, but these may be in contact with each other. For reduction in size of the antenna device, monopole antenna is more preferable than dipole antenna.

In the configuration above, the antenna device in the present embodiment can have broadband antenna characteristics, even when it is reduced in size including height.

Fifth Embodiment

Figure 6:
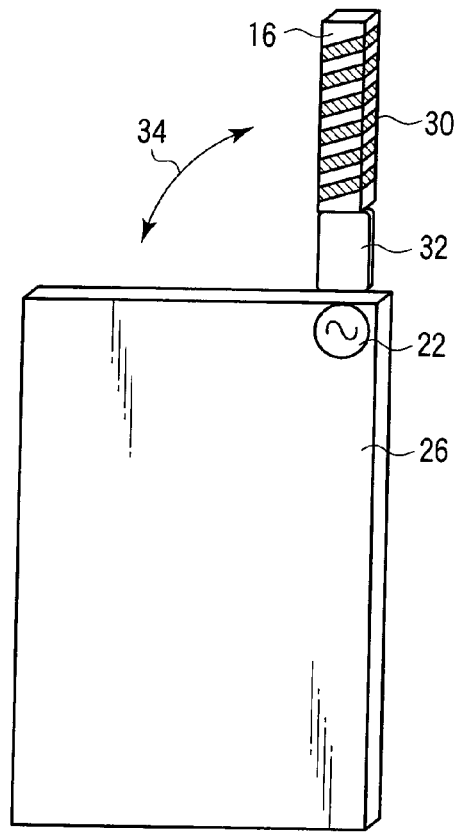
FIG. 6 is a view showing a configuration of a antenna device of a fifth embodiment.

As shown in FIG. 6, the antenna device in the present embodiment comprises a circuit board 26, a spiral antenna element 30 connected to a feeder terminal 28 formed on the circuit board 26, a nanoparticle composite material 16 formed inside the spiral antenna element 30. The antenna element 30 and the circuit board 26 are connected to each other via an antenna movable portion 32. The nanoparticle composite material 16 is the nanoparticle composite material in the first embodiment. Thus, description in duplication with that of the first embodiment will be omitted.

A nanoparticle composite material 16 is formed inside the spiral antenna element 30. The circuit board 26 is, for example, a circuit board on which is mounted a wireless circuit (not shown) of portable device and is covered with a case, for example, of a non-conductive resin such as ABS or PC (polycarbonate). The antenna movable portion 32 may be movable in the range of 90° or 360° in the movable direction 34 or as it is withdrawn.

FIG. 7 is a detailed explanatory view illustrating the antenna device in the present embodiment. FIG. 7 is a magnified drawing of the antenna device, when an antenna cover 36 is formed over the antenna element 30 and the nanoparticle composite material 16 region shown in FIG. 6. The antenna cover 36 is preferably formed for preservation of mechanical strength. The antenna cover 36 is made of a non-conductive resin and includes a box portion 36a and a cap portion 36b. The antenna movable portion 32 is inserted into the opening 36c of the box portion 36a and there is a spiral antenna element 30 formed inside. The antenna movable portion 32 and the spiral antenna element 30 are connected to each other electrically. The antenna cover 36 is formed, as the cap portion 36b is connected to the box portion 36a by fusion or adhesion with an adhesive agent in the state.

The principle of operation in the present embodiment will be described below. Because the antenna element 30 is spiral in shape, it is possible to elongate the antenna in a small space and increase the inductance component and thus, it is more influenced by magnetic permeability than by the permittivity. Thus by forming a nanoparticle composite material 16 inside the spiral antenna element 30, it is less influenced by the permittivity, in particular the loss component, when it is larger to some extent, but influenced more by magnetic permeability, and thus, it is possible to reduce deterioration in radiation efficiency with a material having a smaller magnetic loss component, i.e., having a smaller imaginary part of complex relative permeability, and to expect the effect of size reduction by the real part of complex relative permeability.

As in the present embodiment, it is possible, by placing a nanoparticle composite material 16 inside the spiral antenna element 30, to reduce the size of the antenna element 30, reduce the drastic loss generated in the circuit region, which is greater than that when a lumped-constant circuit is used, and thus, to raise the radiation efficiency of the antenna device.

EXAMPLES

Hereinafter, Examples will be described more in detail relative to Comparative Examples. The average height, average aspect ratio, composition and average diameter of the metal nanoparticles, the presence and composition of the oxide coat layer, and the composition, particle diameter, volume ratio of the oxide-inclusion particles in the nanoparticle composite materials obtained in three Examples and a Comparative Example shown below are summarized in Table 1. The average diameter of the metal nanoparticles, oxide particles and oxide-inclusion particles was determined by TEM observation. Specifically, the particle diameter was determined by measuring the average of the longest diagonal length and the shortest diagonal length of individual particle under TEM observation (photograph) and calculating the average thereof of multiple particles. The thickness of the oxide coat layer was determined as average by TEM observation. The dimension of the nanoparticle aggregate (average height and average aspect ratio) is determined as average by TEM or SEM observation. The volume ratios of the nanoparticle aggregates and the oxide-inclusion particles are calculated simply from the number and the average dimension. In addition, the chemical composition of the microstructure was determined by EDX analysis.

Example 1

First, a thin film is prepared by using a facing-target-typed magnetron sputtering apparatus. A thin film having an average thickness of 0.3 µm is formed by using $Fe_{70}Co_{30}$—$SiO_2$ (ratio of $Fe_{70}Co_{30}$ in the entire mass: 70%) as the target and depositing the particles sputtered from the target on the substrate surface under pressure of 0.67 Pa ($5\times10^{-3}$ torr) while the substrate is rotated at a rate of 10 rpm in the chamber in Ar atmosphere. Then, the thin film is collected, and the collected thin film fragments and SiFeCoO (Si:Fe:Co:O=1:1.4:0.6:4) particles are pulverized and mixed in a planetary mill using $ZrO_2$ balls and a $ZrO_2$ container under Ar atmosphere at approximately 2000 rpm, to give nanoparticle aggregate/SiFeCoO oxide-inclusion particles.

The nanoparticle aggregates obtained are aggregates of FeCoSi (70:30:0.011) metal nanoparticles having an average diameter of 5 nm and an average interparticle distance of 2 nm. The nanoparticle aggregates comprise SiFeCoO oxide.

The nanoparticle aggregate/Si oxide-inclusion particles obtained are mixed with an epoxy resin, and a thick film was formed to give a nanoparticle composite material for evaluation.

Example 2

A film is formed under a condition similar to that in Example 1, except that the target used is changed to $Fe_{70}Co_{30}$—$Al_2O_3$ (ratio of $Fe_{70}Co_{30}$ in entire mass: 56%). The thin film fragments collected were pulverized and mixed with AlFeCoO (Al:Fe:Co:O=2:0.7:0.3:4) particles under a condition similar to that in Example 1 to give nanoparticle aggregate/AlFeCoO oxide-inclusion particles.

The nanoparticle aggregates obtained are aggregates of FeCoAl (70:30:0.015) metal nanoparticles having an average diameter of 4 nm and an average interparticle distance of 2 nm. The nanoparticle aggregates comprise AlFeCoO oxide.

The nanoparticle aggregate/Al oxide-inclusion particles obtained were mixed with an epoxy resin, and a thick film is formed to give a nanoparticle composite material for evaluation.

Example 3

A film is formed under a condition similar to that in Example 1, except that the target used is changed to $Fe_{70}Co_{30}$—$Al_2O_3$ (ratio of $Fe_{70}Co_{30}$ in entire mass: 62%). The thin film prepared is annealed for grain growth of the FeCo metal nanoparticles and also for formation of an oxidized coat layer on the surface of the FeCo metal nanoparticles. The thin film fragments collected were pulverized and mixed with AlFeCoO (Al:Fe:Co:O=2:0.7:0.3:4) particles under a condition similar to that in Example 1 to give nanoparticle aggregate/Al oxide-inclusion particles.

The nanoparticle aggregates obtained are aggregates of FeCoAl (70:30:0.014) metal nanoparticles having an average diameter of 10 nm and an average interparticle distance of 2 nm. The nanoparticle aggregates comprise AlFeCoO oxide.

The nanoparticle aggregate/Al oxide-inclusion particles obtained were mixed with an epoxy resin, and a thick film is formed to give a nanoparticle composite material for evaluation.

Comparative Example 1

$Fe_{70}Co_{30}$ particles having a particle diameter of approximately 50 µm and AlFeCoO particles are pulverized in a planetary mill using $ZrO_2$ balls and a $ZrO_2$ container under Ar atmosphere at approximately 2000 rpm to give FeCo flat particle/$Al_2O_3$ oxide-inclusion particles.

The FeCo flat particle is composed of a single component and is not nanoparticle aggregates. The FeCo flat particle/Al₂O₃ oxide-inclusion particles obtained were mixed with an epoxy resin, and a thick film was formed to give a comparative material for evaluation.

The change over time between the real part of magnetic permeability (μ') and the real part of magnetic permeability (μ') after 100 hours as well as Electromagnetic absorption characteristics, as determined by the following method, of the materials for evaluation obtained in Examples 1 to 3 and Comparative Example 1 is shown in Table 2.

1) Real Part of Magnetic Permeability μ'

Inductive voltage and impedance were determined when air is used as background and also when the sample is placed in PMM-9G1 system of Ryowa Electronics Co., Ltd. at 1 GHz, and the real part of magnetic permeability μ' is calculated from these inductive voltage and impedance. The sample used was a plate-shaped sample previously processed to a dimension of 4×4×0.5 mm.

2) Change Over Time in Real Part of Magnetic Permeability μ' After 100 Hours

After a sample for evaluation is left in a high-temperature constant-humidity tank at a temperature of 60° C. and a humidity of 90% for 100 hours, the real part of magnetic permeability μ' thereof is measured, and the change over time: (real part of magnetic permeability μ' after storage for 100H/real part of magnetic permeability μ' before storage) is determined.

3) Electromagnetic Absorption Characteristics

Two metal sheets having a thickness of 1 mm and the same area are adhered to the electromagnetic irradiation face and the opposite face of the sample for evaluation, and the electromagnetic absorption characteristics are analyzed by reflection power method in free space under an electromagnetic signal at 2 GHz by using $S_{11}$ mode of a sample network analyzer. The reflection power method is a method of determining the decrease in reflection level (dB) when a sample is adhered to a metal sheet, as compared to the reflection level of the metal sheet without adhered sample (perfect reflector). The amount of electromagnetic absorption is defined as reflective decay based on the measurement and expressed as a relative value as compared with 1 of the absorption amount in Comparative Example 1.

TABLE 1

| | Organization of nanoparticle aggregate | | Metal nanoparticle | | | | |
|---|---|---|---|---|---|---|---|
| | Average height (nm) | Average aspect ratio | Magnetic metal | Non-magnetic metal | Composition (atomic ratio) | Average diameter (nm) | Average interparticle distance (nm) |
| Example 1 | 20 | 5 | FeCo | Si | Fe:Co:Si = 70:30:0.011 | 5 | 2 |
| Example 2 | 22 | 6 | FeCo | Al | Fe:Co:Al = 70:30:0.015 | 4 | 2 |
| Example 3 | 30 | 6 | FeCo | Al | Fe:Co:Al = 70:30:0.014 | 10 | 2 |
| Comparative Example 1 | 800 | 10 | FeCo | None | Fe:Co = 70:30 | Flat particle having a height of 800 nm and an aspect ratio of 10 | |

| | Nanoparticle aggregate | | | | | |
|---|---|---|---|---|---|---|
| | Oxide coat layer | | Metal, semi-conductor, oxide, nitride or carbide included | Oxide-inclusion particle | | |
| | Composition | Average thickness (nm) | | Composition | Average diameter (nm) | Volume ratio (%) |
| Example 1 | None | None | Si—Fe—Co—O oxide | Si—Fe—Co—O | 10 | 15 |
| Example 2 | None | None | Al—Fe—Co—O oxide | Al—Fe—Co—O | 15 | 20 |
| Example 3 | Al—Fe—Co—O | 1 | Al—Fe—Co—O oxide | Al—Fe—Co—O | 17 | 20 |
| Comparative Example 1 | Fe—Co—O | 5 | None | Al—Fe—Co—O | 20 | 20 |

TABLE 2

Properties of high-frequency magnetic material

| | Real part of magnetic permeability μ' (under 1 GHz) | Change over time in real part of magnetic permeability μ' after 100 hours (under 1 GHz) | Electromagnetic absorption characteristics (under 2 GHz) |
|---|---|---|---|
| Example 1 | 5.5 | 0.97 | 1.40 |
| Example 2 | 5.7 | 0.97 | 1.45 |
| Example 3 | 6.0 | 0.98 | 1.50 |
| Comparative Example 1 | 3.5 | 0.85 | 1.00 |

As obvious from Table 1, the nanoparticle composite materials according to Examples 1 to 3 contain nanoparticle aggregates in which magnetic metal nanoparticles having an average diameter of 4 to 10 nm are aggregated at an average interparticle distance of 2 nm. It also shows that the nanoparticle aggregate is a flat-shaped aggregate having an average height of 20 nm to 30 nm and an average aspect ratio of 5 to 6. The magnetic metal nanoparticle according to Example 1 is FeCoSi (Fe:Co:Si=70:30:0.011 [molar ratio]). The magnetic metal nanoparticle according to Example 2 contains FeCoAl (Fe:Co:Al=70:30:0.015 [molar ratio]). The magnetic metal nanoparticle according to Example 3 contains FeCoAl (Fe:Co:Al=70:30:0.014 [molar ratio]). In any case, they are the nanoparticles containing magnetic metals FeCo and a non-magnetic metal of Al or Si. In Example 3, the magnetic metal nanoparticles are covered with an AlFeCoO oxide coat layer having a thickness of approximately 1 nm on the surface.

In addition, SiFeCoO oxide-inclusion particles having an average diameter of 10 nm are present at a volume ratio of 15% between the individual nanoparticle aggregates of Example 1. AlFeCoO oxide-inclusion particles having an average diameter of 15 nm are present at a volume ratio of 20% between the individual nanoparticle aggregates of Example 2. AlFeCoO oxide-inclusion particles having an average diameter of 17 nm are present at a volume ratio of 20% between the individual nanoparticle aggregates according to Example 3.

On the other hand, the magnetic material of Comparative Example 1 is a material having a flat structure, but the FeCo particle, uniform flat particle of FeCo, has a composition Fe:Co of 70:30. The flat particle has an average height of 800 nm and an average aspect ratio of 10. In addition, the flat particle has a FeCoO oxide coat layer of about 5 nm in thickness on the surface. AlFeCoO oxide-inclusion particles having an average diameter of approximately 20 nm are present at a volume ratio of 20% between the individual flat particles.

Table 2 summarizes the real part of magnetic permeability ($\mu'$), the change over time in the real part of magnetic permeability after 100 hours ($\mu'$) and the electromagnetic absorption characteristics. As obvious from Table 2, the nanoparticle composite materials according to Examples 1 to 3, in particular the material of Example 3, have magnetic characteristics better than those of the material of Comparative Example 1. Thus, the materials of Examples 1 to 3 are larger in real part of magnetic permeability ($\mu'$) at 1 GHz and smaller in the change over time, better in electromagnetic absorption characteristics at 2 GHz than the material of Comparative Example 1. The nanoparticle aggregates according to Examples 1 to 3 are nanoparticle aggregates containing FeCo nanoparticles having an average diameter of 4 to 10 nm aligned at an average interparticle distance of 2 nm, and the nanoparticle aggregate has a shape having an average height of 20 nm to 30 m and an average aspect ratio of 5 or more. The individual FeCo nanoparticles are isolated physically, but coupled magnetically, and thus behave as an aggregate structure. It is thus possible to reduce the eddy current loss effectively and additionally to improve the magnetic permeability and the high frequency characteristics of magnetic permeability. Because individual metal nanoparticles contain a nonmagnetic metal Al or Si, it is also possible to improve the thermal stability. In particular, the metal nanoparticles of Example 3 comprise an AlFeCoO oxide coat layer containing the magnetic metal FeCo and the non-magnetic metal Al identical with the metal nanoparticles above on the surface, and thus, the thermal stability and the oxidation resistance of the metal nanoparticles are improved. Oxide-inclusion particles are present between the individual nanoparticle aggregates according to Examples 1 to 3 and, because the oxide-inclusion particles contain the magnetic metals identical with the magnetic metals contained in the metal nanoparticle (FeCo in this case) and the same non-magnetic metal (Si in Example 1 or Al in Examples 2 and 3), the thermal stability and the oxidation resistance of the nanoparticle composite material can be further improved. It is considered that, for the reasons above, the nanoparticle composite materials according to Examples 1 to 3 have favorable magnetic permeability at 1 GHz and also favorable thermal stability (smaller change over time) and favorable electromagnetic wave absorption characteristics at 2 GHz. Thus, the nanoparticle composite materials according to Examples 1 to 3 have a $\mu''$ value at 2 GHz larger than that of the material of Comparative Example 1. It may be for that reason that the nanoparticle composite materials according to Examples 1 to 3 have a $\mu''$ peak frequency higher than that of the material of Comparative Example 1.

On the other hand, the particle of Comparative Example 1 is a flat particle having an average aspect ratio of 10, but because it is a metal flat particle containing only a single material therein, the eddy current loss increases and, although it is possible to improve the magnetic permeability at low frequency, the magnetic permeability at high frequency declines to a relatively small value, as shown in Table 2. The electromagnetic wave absorption characteristics in the 2-GHz band are also unfavorable, compared to those in Examples.

As described above, because the nanoparticle composite materials of Examples 1 to 3, in particular that of Example 3, have a large real part of magnetic permeability ($\mu'$) at 1 GHz, these materials may possibly be used, for example, as a high-magnetic-permeability component (using high $\mu'$ and low $\mu''$) in the 1-GHz band range, such as an antenna board for an inductor, filter, transformer, choke coil, cellphone or wireless LAN.

In addition, the nanoparticle composite materials of Examples 1 to 3, in particular that of Example 3, are also superior in thermal stability. In addition, the nanoparticle composite materials of Examples 1 to 3, in particular that of Example 3, have favorable electromagnetic absorption characteristics at 2 GHz and may be used as an electromagnetic wave absorber (using high $\mu''$) in the 2-GHz band range. Thus, it is possible to use these materials as a high-magnetic-permeability component or an electromagnetic wave absorber by selecting a different operation frequency band, and thus, these materials have a wide range of applications.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nanoparticle composite material, comprising:
nanoparticle aggregates in a shape of a plate, a flat ellipsoid, a rod or a spheroid, the shape of a plate having an average thickness of 20 nm or more and 2 µm or less and having an average aspect ratio of width to thickness of 5 or more, the shape of a flat ellipsoid having an average height in a direction perpendicular to a diameter of 20 nm or more and 2 µm or less and having an average aspect ratio of diameter to height of 5 or more, the shape of a rod having an average length of 20 nm or more and 2 µm or less and having an average aspect ratio of length to diameter of a bottom face of 5 or more, the shape of a spheroid having an average minor-axis length of 20 nm or more and 2 µm or less and having an average aspect ratio of major-axis length to minor-axis length of 5 or more, the nanoparticle aggregates comprising metal nanoparticles having an average diameter of 1 nm or more and 20 nm or less and containing at least one magnetic metal selected from the group consisting of Fe, Co and Ni; and
a binder existing between the nanoparticle aggregates.

2. The nanoparticle composite material according to claim 1, wherein the metal nanoparticle further comprises at least one non-magnetic metal selected from Mg, Al, Si, Ca, Zr, Ti, Hf, Zn, Mn, Ba, Sr, Cr, Mo, Ag, Ga, Sc, V, Y, Nb, Pb, Cu, In, Sn and rare earth elements.

3. The nanoparticle composite material according to claim 1, wherein the nanoparticle aggregates further comprise a metal, semiconductor, oxide, nitride or carbide comprising at least one non-magnetic metal selected from Mg, Al, Si, Ca, Zr, Ti, Hf, Zn, Mn, Ba, Sr, Cr, Mo, Ag, Ga, Sc, V, Y, Nb, Pb, Cu, In, Sn and rare earth elements and the magnetic metals, that is present between the metal nanoparticles.

4. The nanoparticle composite material according to claim 3, wherein the oxide, nitride or carbide is formed in particles smaller in particle diameter than the metal nanoparticles.

5. The nanoparticle composite material according to claim 2, further comprising a coat layer coating at least part of the surface of the metal nanoparticle, the coat layer being an oxide, nitride, or carbide comprising at least one magnetic metal identical with those of the metal nanoparticle and at least one non-magnetic metal identical with those of the metal nanoparticle.

6. The nanoparticle composite material according to claim 2, wherein the metal nanoparticle comprises FeCo and at least one element selected from Al and Si, Co is contained in FeCo in an amount of 10 atomic % or more and 50 atomic % or less, and Al or Si is contained in an amount of 0.001 atomic % or more and 5 atomic % or less with respect to FeCo.

7. The nanoparticle composite material according to claim 1, wherein the binder comprises at least one resin selected from PVA resins, PVB resins, epoxy resins, polybutadiene resins, polytetrafluoroethylene resins and polystyrene resins.

8. The nanoparticle composite material according to claim 1, wherein the binder comprises inclusion particles of an oxide, nitride or carbide comprising at least one non-magnetic metal selected from Mg, Al, Si, Ca, Zr, Ti, Hf, Zn, Mn, Ba, Sr, Cr, Mo, Ag, Ga, Sc, V, Y, Nb, Pb, Cu, In, Sn and rare earth elements.

9. The nanoparticle composite material according to claim 8, wherein the inclusion particle of oxide, nitride or carbide comprises at least one of the non-magnetic metals and at least one of the magnetic metals, an atomic ratio of the non-magnetic metal to the magnetic metal of the inclusion particles being larger than an atomic ratio of the non-magnetic metal to the magnetic metal of the metal, semiconductor, oxide, nitride or carbide contained in the nanoparticle aggregate.

10. An antenna device, comprising the nanoparticle composite material according to claim 1.

11. An electromagnetic absorber, comprising the nanoparticle composite material according to claim 1.

* * * * *